(12) United States Patent
Boyer, Jr.

(10) Patent No.: US 7,846,750 B2
(45) Date of Patent: Dec. 7, 2010

(54) TEXTURED REAR ELECTRODE STRUCTURE FOR USE IN PHOTOVOLTAIC DEVICE SUCH AS CIGS/CIS SOLAR CELL

(75) Inventor: Leonard L. Boyer, Jr., Flat Rock, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 570 days.

(21) Appl. No.: 11/808,764

(22) Filed: Jun. 12, 2007

(65) Prior Publication Data

US 2008/0308156 A1 Dec. 18, 2008

(51) Int. Cl.
H01L 21/00 (2006.01)
H01L 31/00 (2006.01)

(52) U.S. Cl. .................. 438/19; 136/256; 257/E27.125

(58) Field of Classification Search ................... 438/19; 136/256
See application file for complete search history.

(56) References Cited

U.S. PATENT DOCUMENTS

| | | | | |
|---|---|---|---|---|
| 4,935,383 A | * | 6/1990 | Nouhi et al. | 117/104 |
| 4,942,138 A | * | 7/1990 | Miki | 438/659 |
| 5,101,260 A | | 3/1992 | Nath et al. | |
| 5,282,902 A | * | 2/1994 | Matsuyama | 136/249 |
| 5,296,045 A | | 3/1994 | Banerjee et al. | |
| 5,569,332 A | | 10/1996 | Glatfelter et al. | |
| 5,620,530 A | | 4/1997 | Nakayama | |
| 5,738,731 A | * | 4/1998 | Shindo et al. | 136/249 |
| 5,891,264 A | * | 4/1999 | Shinohara et al. | 136/261 |
| 5,981,934 A | | 11/1999 | Higashikawa | |
| 6,072,117 A | | 6/2000 | Matsuyama et al. | |
| 6,123,824 A | | 9/2000 | Sano et al. | |
| 6,288,325 B1 | | 9/2001 | Jansen et al. | |
| 6,331,672 B1 | | 12/2001 | Matsuda et al. | |
| 6,534,336 B1 | * | 3/2003 | Iwane et al. | 438/71 |
| 6,563,041 B2 | * | 5/2003 | Sugawara et al. | 136/250 |
| 6,613,603 B1 | | 9/2003 | Sano | |
| 6,784,361 B2 | | 8/2004 | Carlson et al. | |
| 6,878,403 B2 | | 4/2005 | Veerasamy et al. | |
| 6,951,689 B1 | | 10/2005 | Higashikawa | |
| 7,049,003 B2 | | 5/2006 | Thomsen et al. | |

(Continued)

FOREIGN PATENT DOCUMENTS

EP 1 691 421 8/2006

OTHER PUBLICATIONS

"A Comprehensive Characterization of the Interfaces in Mo/CIS/CdS/ZnO Solar Cell Structures", Schmid et al., Solar Energy Materials and Solar Cells 41/42 (1996) pp. 281-294.

*Primary Examiner*—W. David Coleman
(74) *Attorney, Agent, or Firm*—Nixon & Vanderhye P.C.

(57) ABSTRACT

A photovoltaic device including a rear electrode which may also function as a rear reflector. In certain example embodiments, the rear electrode comprises a reflective film (e.g., of Mo or the like) including one or more layers provided on an interior surface of a rear glass substrate of the photovoltaic device. In certain example embodiments, the interior surface(s) of the rear glass substrate and/or reflective film is/are textured so as to provide desirable electrical and reflective characteristics. The rear glass substrate and textured rear electrode/reflector are used in a photovoltaic device (e.g., CIS or CIGS solar cell) where an active semiconductor film is provided between the rear electrode/reflector and a front electrode(s).

26 Claims, 5 Drawing Sheets

U.S. PATENT DOCUMENTS

| | | |
|---|---|---|
| 2002/0157703 A1* | 10/2002 | Nakayama et al. .......... 136/256 |
| 2004/0261841 A1 | 12/2004 | Negami et al. |
| 2005/0215079 A1 | 9/2005 | Taunier et al. |
| 2006/0180200 A1 | 8/2006 | Platzer Bjorkman et al. |
| 2007/0044834 A1 | 3/2007 | Berke et al. |
| 2008/0308147 A1* | 12/2008 | Lu et al. .................... 136/256 |

* cited by examiner

TEXTURED REAR ELECTRODE STRUCTURE FOR USE IN PHOTOVOLTAIC DEVICE SUCH AS CIGS/CIS SOLAR CELL

This invention relates to a photovoltaic device including a rear (or back) electrode which may also function as a rear (or back) reflector. In certain example embodiments of this invention, the rear electrode comprises a metallic based reflective film including one or more layers provided on an interior surface of a rear glass substrate of the photovoltaic device. In certain example embodiments, the interior surface of the rear glass substrate is textured so that the rear electrode deposited thereon is also textured so as to provide desirable electrical and reflective characteristics. The rear electrode (e.g., of or including Mo) may be additionally textured in certain example instances via a separate texturing process after it has been deposited. The textured rear glass substrate and textured rear electrode/reflector are used in a photovoltaic device (e.g., CIS or CIGS solar cell) where an active semiconductor film is provided between the rear electrode/reflector and a front electrode(s).

BACKGROUND AND SUMMARY OF EXAMPLE EMBODIMENTS OF INVENTION

Photovoltaic devices are known in the art (e.g., see U.S. Patent Document Nos. 2004/0261841, 2006/0180200, U.S. Pat. Nos. 6,784,361, 6,288,325, 6,613,603, and 6,123,824, the disclosures of which are hereby incorporated herein by reference). Examples of photovoltaic devices include CIGS $(Cu(In, Ga)(Se, S)_2)$, CIS $(CuInSe_2)$, and a-Si (amorphous silicon) solar cells. The CIGS and CIS films are conductive semiconductor compounds, and these stoichiometries are approximations.

Generally speaking, CIGS and CIS type photovoltaic devices include, from the front or light incident side moving rearwardly, a front substrate of a material such as glass, a front electrode comprising a transparent conductive layer such as a TCO (transparent conductive oxide), a light absorption semiconductor film (e.g., CIGS and/or CIS film), a rear electrode, and a rear substrate of a material such as glass. Sometimes an adhesive is provided between the front substrate and the front electrode, and it is also possible for window layer(s) (e.g., of or including CdS, ZnO, or the like) to be provided. Photovoltaic power is generated when light incident from the front side of the device passes through the front electrode and is absorbed by the light absorption semiconductor film as is known in the art.

However, there exists a need in the art for one or more of: improving efficiency of such photovoltaic devices, reducing the cost of such photovoltaic devices, and/or improving durability of such photovoltaic devices. Thus, it will be appreciated that there exists a need in the art for an improved photovoltaic device that can solve or address one or more of the aforesaid problems.

In certain example embodiments of this invention, a rear electrically conductive electrode comprising Mo (molybdenum) is provided. The Mo inclusive rear electrode is formed in a manner so that its major surface to be closest to the light absorption semiconductor film is textured (roughened) in a substantially controlled and desired manner. In certain example embodiments, the interior surface of the rear glass substrate is textured (roughened) via acid etching, ion beam treatment, or the like. Then, the Mo inclusive rear electrode is formed on the textured surface of the rear glass substrate in a manner so that the major surface of the rear electrode to be closest to the light absorption semiconductor film is also textured. In certain example embodiments, the textured major surface of the rear electrode to be closest to the light absorption semiconductor film may be substantially conformal to the textured surface of the rear glass substrate.

The textured interior surface of the rear electrode is advantageous in several example respects. The textured surface of the rear electrode improves adhesion between the rear electrode and the semiconductor film. Moreover, the textured surface of the rear electrode allows the rear electrode to act as a scattering back electrode thereby permitting it to reflect incident light more effectively and efficiently into the light absorption semiconductor film. This can allow one of both of: improved efficiency of the photovoltaic device, and/or reduced thickness of the light absorption semiconductor film without sacrificing solar efficiency.

In certain example embodiments, after the rear electrode has been formed on the rear glass substrate, the major surface of the rear electrode to be closest to the light absorption semiconductor film may be textured via one or more of ion beam treatment, plasma exposure, and/or a wet chemical etch such as HCl, nitric acid, acetic acid or a combination thereof. This post-deposition texturing (roughening) of the rear electrode surface may, or may not, be used in combination with embodiments where the rear glass substrate is textured. Thus, when the rear electrode is textured (roughened) after the deposition thereof, the rear glass substrate may or may not be textured.

The textured rear glass substrate and/or textured rear electrode (which also functions as a reflector) may be used in a photovoltaic device (e.g., CIS or CIGS solar cell) where an active semiconductor film is provided between the rear electrode/reflector and a front electrode(s).

In certain example embodiments of this invention, there is provided a photovoltaic device comprising: a front substantially transparent conductive electrode; a semiconductor film; a conductive and reflective rear electrode comprising Mo; a rear glass substrate that supports at least the rear electrode comprising Mo; and wherein a surface of the rear glass substrate closest to the semiconductor film is textured so as to have peaks and valleys defined therein, and the rear electrode comprising Mo is provided on the rear glass substrate over the peaks and valleys defined in the rear glass substrate so that the rear electrode comprising Mo also has peaks and valleys defined in a surface thereof closest to the semiconductor film.

In certain example embodiments of this invention, there is provided photovoltaic device comprising: a front substrate; a front substantially transparent conductive electrode; an active semiconductor film; a conductive and reflective rear electrode; a rear glass substrate that supports at least the rear electrode; and wherein the rear electrode comprises a first layer comprising Ti and/or Cr and a second conductive layer comprising Mo provided on the rear glass substrate over at least the first layer, so that the first layer comprising Ti and/or Cr is located between the rear glass substrate and the second layer comprising Mo.

In certain example embodiments of this invention, there is provided a photovoltaic device comprising: a front substrate; a front substantially transparent conductive electrode; an active semiconductor film; a conductive and reflective rear electrode; a rear glass substrate that supports at least the rear electrode; and wherein the rear electrode comprises a layer comprising Mo that is oxidation graded, continuously or discontinuously, so as to be more metallic at a location therein closer to the semiconductor film than at a location therein closer to the rear glass substrate.

In certain example embodiments, there is provided a photovoltaic device comprising: a front substrate; a front substantially transparent conductive electrode; an absorber semiconductor film; a conductive and reflective rear electrode; a rear glass substrate that supports at least the rear electrode; and wherein the rear electrode comprises a first layer comprising an oxide of Mo and a second conductive layer comprising substantially metallic Mo provided on the rear glass substrate over at least the first layer, so that the first layer comprising the oxide of Mo is located between the rear glass substrate and the second layer comprising substantially metallic Mo.

In certain example embodiments, there is provided method of making a rear electrode structure for a photovoltaic device, the method comprising: providing a glass substrate; depositing a conductive electrode on the glass substrate, and then ion beam treating a major surface of the electrode in order to texture, or additionally texture, the major surface of the electrode thereby providing a textured electrode having a textured reflective surface; and using the textured electrode, supported by at least the glass substrate, as a rear electrode in a photovoltaic device.

In certain example embodiments, there is provided a method of making a photovoltaic device, the method comprising: providing a glass substrate; depositing a conductive electrode comprising Mo on the glass substrate, and then texturing a major surface of the electrode comprising Mo thereby providing a textured electrode comprising Mo having a textured reflective surface; and using the textured electrode comprising Mo, supported by at least the glass substrate, as a rear electrode in a photovoltaic device.

DETAILED DESCRIPTION OF EXAMPLE EMBODIMENTS OF THE INVENTION

Figure 1:
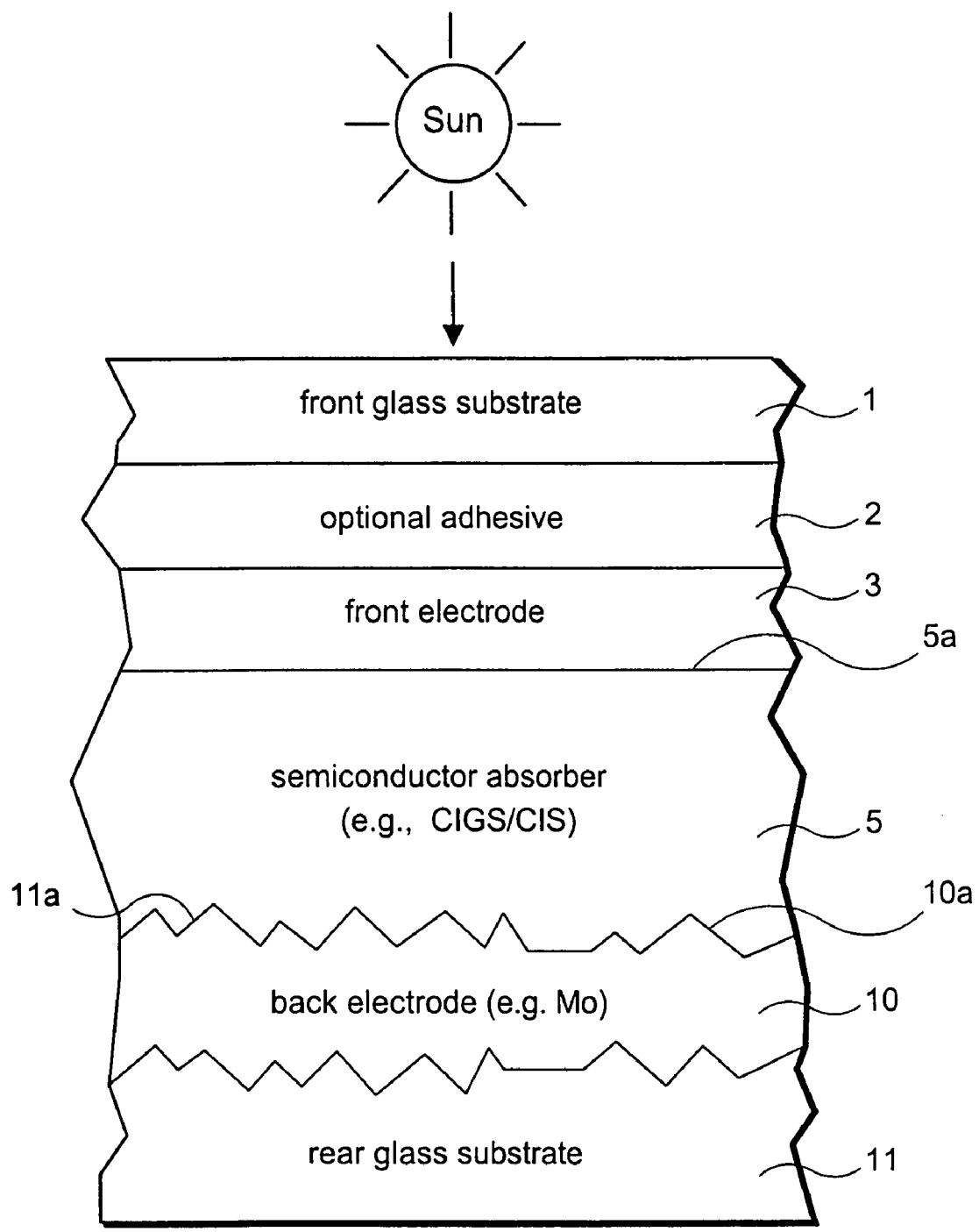
FIG. 1 is a cross sectional view of an example photovoltaic device according to an example embodiment of this invention.

Referring now more particularly to the figures in which like reference numerals refer to like parts/layers in the several views.

Photovoltaic devices such as solar cells convert solar radiation into usable electrical energy. The energy conversion occurs typically as the result of the photovoltaic effect. Solar radiation (e.g., sunlight) impinging on a photovoltaic device and absorbed by an active region of semiconductor material (e.g., a semiconductor film including one or more semiconductor layers such as a-Si, CIS, CIGS or the like, the semiconductor sometimes being called an absorbing layer or film) generates electron-hole pairs in the active region. The electrons and holes may be separated by an electric field of a junction in the photovoltaic device. The separation of the electrons and holes by the junction results in the generation of an electric current and voltage. In certain example embodiments, the electrons flow toward the region of the semiconductor material having n-type conductivity, and holes flow toward the region of the semiconductor having p-type conductivity. Current can flow through an external circuit connecting the n-type region to the p-type region (or vice versa) as light continues to generate electron-hole pairs in the photovoltaic device.

In certain example embodiments, single junction amorphous silicon (a-Si) photovoltaic devices include three semiconductor layers. In particular, the semiconductor film includes a p-layer, an n-layer and an i-layer which is intrinsic. The amorphous silicon film (which may include one or more layers such as p, n and i type layers) may be of hydrogenated amorphous silicon in certain instances, but may also be of or include hydrogenated amorphous silicon carbon or hydrogenated amorphous silicon germanium, or the like, in certain example embodiments of this invention. For example and without limitation, when a photon of light is absorbed in the i-layer it gives rise to a unit of electrical current (an electron-hole pair). The p and n-layers, which contain charged dopant ions, set up an electric field across the i-layer which draws the electric charge out of the i-layer and sends it to an optional external circuit where it can provide power for electrical components. In certain other example embodiments of this invention, the absorption semiconductor film may be of or include CIGS (approximately $Cu(In, Ga)(Se, S)_2$) and/or CIS (approximately $CuInSe_2$). However, it is noted that while certain example embodiments of this invention are directed toward CIGS, CIS and/or amorphous-silicon based photovoltaic devices, this invention is not so limited and may be used in conjunction with other types of photovoltaic devices in certain instances including but not limited to devices including other types of semiconductor material, single or tandem thin-film solar cells, CdS and/or CdTe photovoltaic devices, polysilicon and/or microcrystalline Si photovoltaic devices, and the like.

FIG. 1 is a cross sectional view of a photovoltaic device according to an example embodiment of this invention. The photovoltaic device includes transparent front glass substrate 1, optional adhesive film 2, single layer or multilayer front conductive electrode 3, active semiconductor film 5 of or including one or more semiconductor layers (such as CIGS, CIS, a-Si, or the like), electrically conductive back electrode/reflector 10, and rear glass substrate 11. Rear electrode 10 is preferably continuous or substantially continuous across all or a substantial portion of glass substrate 1, although it may be patterned into a desired design (e.g., stripes) in certain instances. The optional adhesive 2 may be of or include an electrically insulating polymer based and/or polymer inclusive encapsulant or adhesive of a material such as ethyl vinyl acetate (EVA), polyvinyl butyral (PVB), or the like. In certain example embodiments, polymer based adhesive layer 2 has a refractive index (n) of from about 1.8 to 2.2, more preferably from about 1.9 to 2.1, with an example being about 2.0, for purposes of optical matching. Of course, other layer(s) which are not shown may also be provided in the device. For instance, buffer and/or window layer(s) may also optionally be provided.

Front glass substrate 1 and/or rear glass substrate 11 may be made of soda-lime-silica based glass in certain example embodiments of this invention; and front glass substrate 1 may have low iron content (e.g., less than about 0.0% total iron, more preferably less than about 0.08, 0.07 or 0.06% total iron) and/or an antireflection coating (not shown) thereon to optimize transmission in certain example instances. While substrates 1, 11 may be of glass in certain example embodiments of this invention, other materials such as quartz or the like may instead be used for substrate(s) 1 and/or 11. Glass substrate(s) 1 and/or 11 may or may not be thermally tempered in certain example embodiments of this invention. Additionally, it will be appreciated that the word "on" as used herein covers both a layer being directly on and indirectly on something, with other layers possibly being located therebetween.

With respect to FIGS. 1-5, the interior surface of the rear glass substrate 11I is macroscopically textured as shown in the figures in order to improve reflective scattering, and the rear electrode 10 is deposited (e.g., via sputtering or the like) on the textured surface 11a of the substrate 11. Rear electrode 10 is thus able to reflect significant amounts of light in the 500-800 nm, and/or 600-800 nm wavelength range, thereby permitting such light to be trapped in the semiconductor film 5 to enhance the photovoltaic efficiency of the device. In certain example embodiments, the macroscopically textured interior surface 11a of glass substrate 11 may have any suitable textured pattern, such as a pyramid pattern obtained by rolling or the like, a random pattern achieved by ion beam treatment, rolling, and/or acid etching. This textured pattern may have a periodicity of from about 100 μm to 1 mm (more preferably from about 250 to 750 μm) in certain example embodiments, depending on the capabilities of the glass patterning line, ion beam treatment, and/or etching process. Other possible patterns for the interior surface 11a of glass 11 include triangular or sawtooth trough patterns and, in general, any combination of slanted patterns which maximizes or substantially maximizes multiple internal reflections.

In certain example embodiments of this invention, rear electrode 10 comprises Mo (molybdenum) and is provided on, directly or indirectly, rear glass substrate 11. The Mo inclusive rear electrode 10 is formed in a manner so that its major surface 10a to be closest to the light absorption semiconductor film 5 is textured (roughened) in a substantially controlled and desired manner. In certain example embodiments, the interior surface 11a of the rear glass substrate 11 is textured (roughened) via acid etching, ion beam treatment, or the like. Then, after the glass substrate 11 is textured, the Mo inclusive rear electrode 10 is formed on the textured surface 11a of the rear glass substrate 11 in a manner so that the major surface 10a of the rear electrode 10 to be closest to the light absorption semiconductor film 5 is also textured. In certain example embodiments, the textured major surface 10a of the rear electrode 10 to be closest to the light absorption semiconductor film may be substantially conformal to the textured surface 11a of the rear glass substrate 11. The textured surface(s) of the rear electrode 10 permit(s) the rear electrode to provide both desirable electrical and reflective characteristics.

The textured interior surface 10a of the rear electrode 10 is advantageous in several example respects. The textured surface 10a of the rear electrode improves adhesion between the rear electrode 10 and the semiconductor film 5, regardless of whether or not they directly contact each other. Moreover, the textured surface 10a of the rear electrode 10 allows the rear electrode to act as a scattering back electrode thereby permitting it to reflect incident light (light which has come into the device from the sun or the like and passed through the front electrode 3 and film 5) more effectively and efficiently back into the light absorption semiconductor film 5. This can allow one of both of: improved efficiency of the photovoltaic device, and/or reduced thickness of the light absorption semiconductor film 5 without sacrificing solar efficiency.

Still with respect to FIGS. 1-5, in certain example embodiments, after the rear electrode 10 has been formed on the rear glass substrate 11, the major surface of the rear electrode 10 to be closest to the light absorption semiconductor film 5 may be textured via one or more of ion beam treatment, plasma exposure, and/or a wet chemical etch such as HCl, nitric acid, acetic acid or a combination thereof, to form textured surface 10a. This post-deposition texturing (roughening) of the rear electrode surface 10a may, or may not, be used in combination with embodiments where the rear glass substrate is textured. Thus, when the surface 10a of the rear electrode 10 is textured (roughened) after the deposition of the rear electrode on the substrate 11, the rear glass substrate 11 may or may not be textured.

Because of this improved back electrode structure (10 and/or 11) which provides improved reflection back into the semiconductor film 5, the front electrode 3 and/or front substrate 1 need not be textured (although it or they may be in certain instances). Moreover, the light incident surface 5a of the semiconductor film 5 need not be textured (although it may be in certain instances). Because the front electrode 3 and semiconductor film 5 may be smooth or substantially smooth, the reliability and/or manufacturing yield of the device can be improved, and possibly a thinner semiconductor film 5 may be used in certain example instances. Moreover, the smooth nature of front electrode 3 may allow a multi-layer coating including at least one silver layer or the like to be used to form the front electrode 3 in certain example instances; such coatings for electrode 3 may have an improved (e.g., lower) sheet resistance while at the same time maintaining high transmission in the part of the spectrum in which the photovoltaic device is sensitive (e.g., 350 to 750, 350 to 800 nm, or possibly up to about 1100 nm for certain types). Low sheet resistance is advantageous in that it allows for less dense laser scribing and may lead to lower scribe losses. Furthermore, the total thickness of such a multilayer front electrode 3 may be less than that of a conventional TCO front electrode in certain example non-limiting instances, which can reduce the cost of the product and increase throughput. Example multi-layer coatings for the front electrode 3 are described in U.S. Ser. No. 11/724,326, the disclosure of which is hereby incorporated herein by reference.

Figure 2:
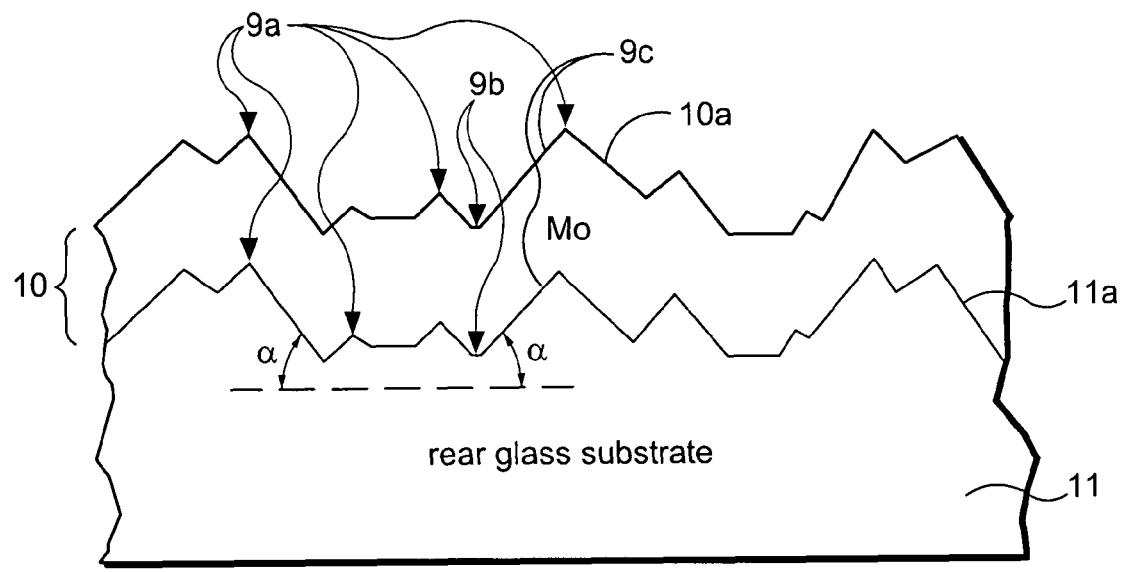
FIG. 2 is a cross-sectional view of an example rear electrode and rear glass substrate that may be used in the photovoltaic device of FIG. 1 in an example embodiment of this invention.

FIG. 2 is an enlarged cross-sectional view of an example rear electrode structure for use in the photovoltaic device of FIG. 1 in an example embodiment of this invention. FIG. 2 illustrates that the rear electrode structure includes rear glass substrate 11 which may be substantially transparent, and rear electrode 10. In the FIG. 2 embodiment the rear electrode 10 is of or includes Mo, and may be metallic or substantially metallic so as to be reflective. In the FIG. 2 embodiment, the textured surfaces 10a and 11a of the rear electrode 10 and rear glass substrate 11, respectively, have peaks 9a, valleys 9b between the peaks, and inclined portions 9c connecting the peaks and valleys.

Referring to FIGS. 1-5, incident light from the sun makes its way first through front substrate 1 and front electrode 3, and into semiconductor film 5. Some of this light proceeds through semiconductor film 5 thereby reaching rear electrode 10, and is reflected by the rear electrode 10 which is provided on the interior textured surface of the rear substrate 11. It has been found that especially good reflection occurs in certain example instances when reflective rear electrode 10 includes inclined portions 9c which form an angle(s) α with the plane (and/or rear surface) of the rear substrate 11, where α is at least about 20 degrees, more preferably from about 25-50 degrees, even more preferably from about 25-40 or 25-35 degrees (note: angle α is shown in FIG. 2 with respect to the inclined portions 9c of the rear substrate, but this also applies to the inclined portions 9c of the rear electrode 10). While not shown in FIGS. 3-5 for purposes of simplicity, this concept regarding angle(s) α is also applicable to those figures. Causing this angle α to be within such a range for at least some inclined portions is advantageous in that more light is kept in the cell (i.e., in the semiconductor 5 for conversion to current) so that the efficiency of the photovoltaic device is improved.

In certain example embodiments of this invention (e.g., see FIG. 1), a single layer front electrode 3 may be used in the device. An example single-layer front electrode 3 may be of a TCO such as tin oxide (possibly fluorinated), zinc oxide, ITO, or the like.

In other example embodiments, a multilayer front electrode 3 may be used in the photovoltaic device. Example multilayer front electrodes 3 are described in U.S. Ser. Nos. 11/724,326 filed Feb. 27, 2007 and 11/591,668 filed Nov. 2, 2006 (both hereby incorporated herein by reference in their entireties), for purposes of example. Such an example multilayer front electrode 3 includes from the glass substrate 1 moving toward the semiconductor film 5, a first transparent conductive oxide (TCO) layer, a first conductive substantially metallic IR reflecting layer (e.g., of Ag or the like), a second TCO layer, second conductive substantially metallic IR reflecting layer (e.g., of Ag or the like), a third TCO layer, and optionally a buffer layer. Optionally, the first TCO layer may be a dielectric layer instead of a TCO in certain example instances and serve as a seed layer for the first conductive substantially metallic IR reflecting layer. Of course, it is possible for certain layers of this multilayer front electrode to be removed in certain alternative embodiments of this invention, and it is also possible for additional layers to be provided in the multilayer front electrode. Front electrode 3 may be continuous across all or a substantial portion of glass substrate 1 and may be flat in certain example instances (i.e., not textured), or alternatively may be patterned into a desired design (e.g., stripes), in different example embodiments of this invention. Each of layers/films 1-3 is substantially transparent in certain example embodiments of this invention.

The active absorption semiconductor region or film 5 may include one or more layers, and may be of any suitable material. In certain example embodiments of this invention, the absorption semiconductor film 5 is of or includes $ABC_x$, where A is a group IB element(s) such as Cu, Ag and/or Au, B is a group IIIA element(s) such as In and/or Ga, C is a group VI element(s) such as Se and/or S, and x is from about 1.5 to 2.5, more preferably from about 1.9 to 2.1, with an example value of x being about 2.0. Thus, the semiconductor film 5 may be of or include CIGS (approximately Cu(In or Ga)(Se or $S)_2$) and/or CIS (approximately $CuInSe_2$) in certain example embodiments. The active semiconductor film 5 may be formed by any suitable technique, including but not limited to vacuum evaporation or the like. Alternatively, the semiconductor film 5 may be of or include a-Si or other suitable material in certain instances.

Rear conductive electrode 10 (sometimes referred to as a back contact) may include one or more layers, and comprises molybdenum (Mo) in certain example embodiments. In certain example embodiments, the rear electrode 10 is in direct contact with the semiconductor film 5. Rear electrode 10 may be formed via sputtering or any other suitable technique in different example embodiments of this invention.

FIG. 2 is a cross-sectional view of an example conductive and substantially opaque rear electrode (and reflector) 10 and rear glass substrate 11 that may be used in the photovoltaic device of FIG. 1 in an example embodiment of this invention. In the FIG. 2 embodiment, the rear electrode 10 is of a single metallic or substantially metallic layer of Mo. The conductive and reflective Mo electrode 10 may optionally be doped with small amounts of other elements in certain instances. The thickness of the Mo electrode 10 may be varied depending on the desired sheet resistance of the rear electrode. In certain example instances, the Mo electrode 10 in the FIG. 2 embodiment may be from about 1500 to 5000 Å thick, more preferably from about 2500 to 4500 Å thick.

Figure 3:
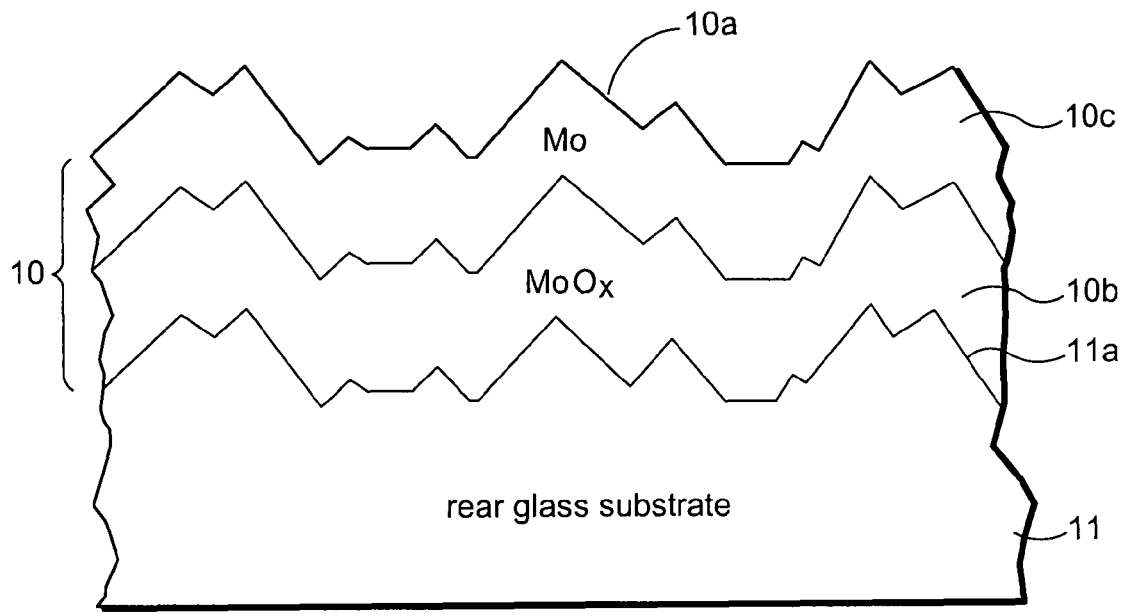
FIG. 3 is a cross-sectional view of another example rear electrode and rear glass substrate that may be used in the photovoltaic device of FIG. 1 in an example embodiment of this invention.

FIG. 3 is a cross-sectional view of an example conductive and substantially opaque rear electrode (and reflector) 10 and rear glass substrate 11 that may be used in the photovoltaic device of FIG. 1 in another example embodiment of this invention. The rear electrode 10 in this embodiment is the same as that discussed above with the following exceptions. In the FIG. 3 embodiment, the rear electrode 10 includes a first layer 10b of or including an oxide of Mo (molybdenum) (e.g., $MoO_x$, where in certain example embodiments x may be from about 0.2 to 1.1, more preferably from about 0.5 to 1.0) and a second metallic or substantially metallic layer 10c of or based on Mo. The thickness of the Mo layer 10c may be varied depending on the desired sheet resistance of the rear electrode. In certain example instances, the Mo layer 10c may be from about 1500 to 5000 Å thick, more preferably from about 2500 to 4500 Å thick, and the $MoO_x$ layer 10b may be from about 50 to 1000 Å thick, more preferably from about 100 to 600 Å thick, and most preferably from about 200 to 300 Å thick. While the Mo layer 10c may be deposited by sputtering a Mo target(s) in certain example embodiments in an atmosphere of argon gas or the like, the $MoO_x$ layer 10b may be deposited by sputtering a Mo or $MoO_x$ target(s) (e.g., in an argon, or an argon/oxygen gas atmosphere). In certain example embodiments, the Mo based layer 10c may be oxidation graded, continuously or discontinuously, so as to be more metallic at a location therein closer to the semiconductor film 5 than at a location therein closer to the substrate 11. These layers 10b and/or 10c may be sputter-deposited at room temperature in certain example embodiments, or also may be deposited in heat vacuum chamber(s). Optionally, the glass 11 may be heated when one or both of these layers is sputter-deposited in certain example instances. Heating the glass (e.g., using temperatures of from about 150-300 degrees C., more preferably from about 200-250 degrees C.) may be advantageous in that the heat causes a more dense Mo layer to be formed thereby resulting in lower sheet resistance for the layer. Thus, for a given sheet resistance, a thinner Mo layer 10c may be used in certain example instances.

Still referring to the FIG. 3 embodiment (and the FIG. 4-5 embodiments where Mo oxide may also be used in the rear electrode), it has been found that sodium (Na) migration from the rear glass substrate 11 improves the performance of CIS and/or CIGS photovoltaic devices. In particular, it has been found that sodium migration from the rear glass substrate 11 to the surface of the Mo based layer 10 closest to the semiconductor improves the performance of CIS and/or CIGS photovoltaic devices. From about 3-5% sodium migration to the surface of the Mo based electrode has been found to be particularly beneficial in certain example instances. Accordingly, it has been found that such sodium migration from the glass 11 is desired to some extent. It has surprisingly been found that the presence of the $MoO_x$ layer 10b helps accelerate such sodium migration from the rear glass substrate 11 to the surface of the Mo based electrode 10 during heat treatment at high temperatures used during processing/manufacturing of the device. Thus, it will be appreciated that the use of the $MoO_x$ layer 10b in the rear electrode is highly advantageous in certain example embodiments of this invention due to its ability to increase Na diffusion from the glass 11 to the surface of the electrode 10 adjacent the semiconductor 5 and possibly into the semiconductor 5. The $MoO_x$ layer 10b may be conductive, semiconductive, or non-conductive in different embodiments, depending on the amount of oxygen provided in the layer. Small amounts of other element(s) may also be provided in layer(s) 10b and/or 10c in certain instances.

Figure 4:
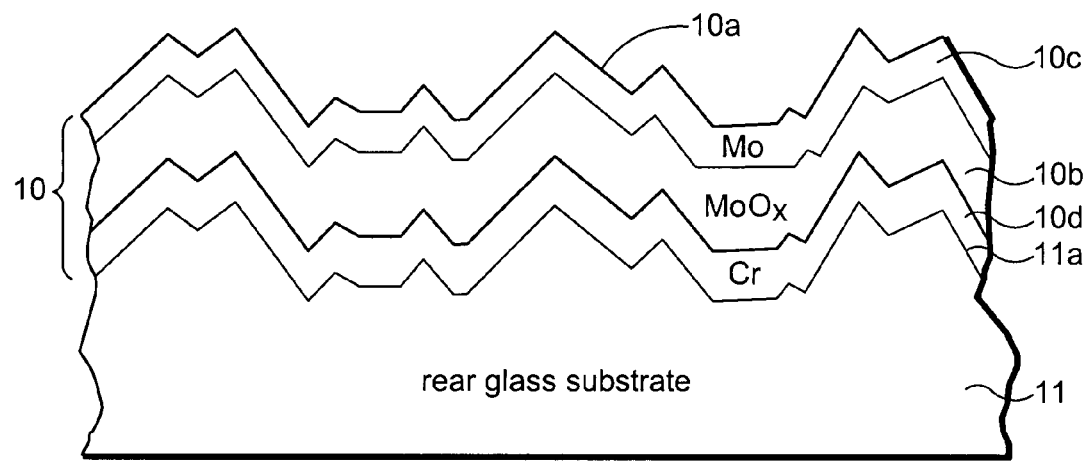
FIG. 4 is a cross-sectional view of another example rear electrode and rear glass substrate that may be used in the photovoltaic device of FIG. 1 in an example embodiment of this invention.

FIG. 4 is a cross-sectional view of an example conductive and substantially opaque rear electrode (and reflector) 10 and rear glass substrate 11 that may be used in the photovoltaic device of FIG. 1 in another example embodiment of this invention. The rear electrode 10 in this embodiment is the same as that discussed above with respect to FIGS. 1-3 with the following exceptions. In the FIG. 4 embodiment, the rear electrode 10 includes a first metallic or substantially metallic layer 10d of or based on Cr, a second layer 10b of or including an oxide of Mo (molybdenum) (e.g., $MoO_x$, where in certain example embodiments x may be from about 0.2 to 1.1, more preferably from about 0.5 to 1.0), and a third metallic or substantially metallic layer 10c of or based on Mo. In certain example embodiments, the Cr based layer 10d may be from about 50 to 1000 Å thick, more preferably from about 100 to 600 Å thick, and most preferably from about 200 to 300 Å thick. Example thicknesses of, and deposition techniques for, layers 10b and 10c are discussed above. It has been found that the Cr layer 10d is advantageous in that it permits better adhesion of the layer 10b and/or 10c to the glass 11. In alternatives of the FIG. 4 embodiment, the $MoO_x$ layer 10b may be omitted so that the Cr layer 10d and the Mo layer 10c directly contact each other (this may serve to advantageous reduce the sheet resistance of the rear electrode in certain example instances). The Cr layer 10d may include other element(s) such as Ni and/or oxygen in certain example instances.

Figure 5:
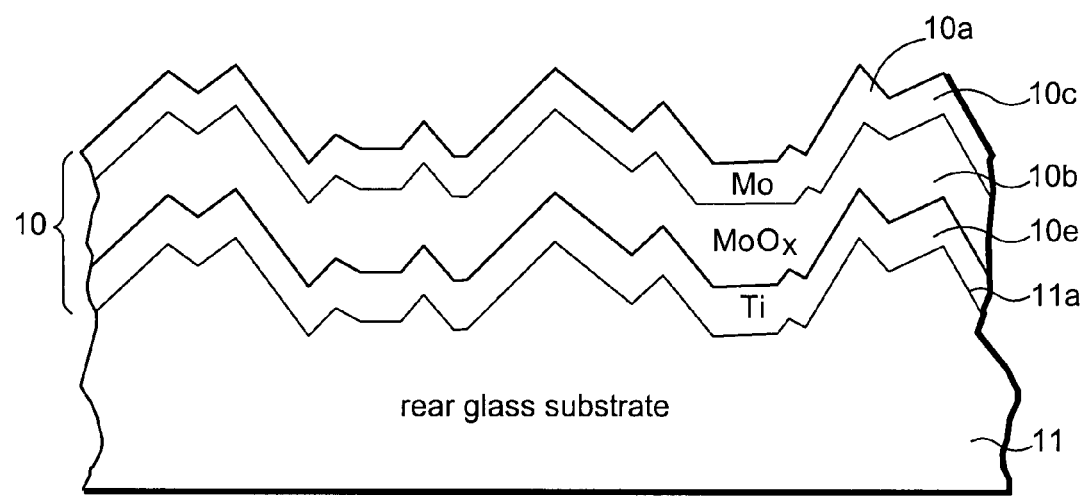
FIG. 5 is a cross-sectional view of another example rear electrode and rear glass substrate that may be used in the photovoltaic device of FIG. 1 in an example embodiment of this invention.

FIG. 5 is a cross-sectional view of an example conductive and substantially opaque rear electrode (and reflector) 10 and rear glass substrate 11 that may be used in the photovoltaic device of FIG. 1 in another example embodiment of this invention. The rear electrode 10 in this embodiment is the same as that discussed above with respect to FIGS. 1-3 with the following exceptions. In the FIG. 5 embodiment, the rear electrode 10 includes a first metallic or substantially metallic layer 10e of or based on Ti, a second layer 10b of or including an oxide of Mo (molybdenum) (e.g., $MoO_x$, where in certain example embodiments x may be from about 0.2 to 1.1, more preferably from about 0.5 to 1.0), and a third metallic or substantially metallic layer 10c of or based on Mo. In certain example embodiments, the Ti based layer 10e may be from about 50 to 1000 Å thick, more preferably from about 100 to 600 Å thick, and most preferably from about 200 to 300 Å thick. Example thicknesses of, and deposition techniques for, layers 10b and 10c are discussed above. It has been found that the Ti layer 10d is advantageous in that it permits better adhesion of the layer 10b and/or 10c to the glass 11. In alternatives of the FIG. 5 embodiment, the $MoO_x$ layer 10b may be omitted so that the Ti layer 10e and the Mo layer 10c directly contact each other (this may serve to advantageous reduce the sheet resistance of the rear electrode in certain example instances). The Ti layer 10e may include other element(s) such as nitrogen and/or oxygen in certain example instances.

It is of course possible for other layers to be provided, or for certain layers to be omitted, in other example embodiments of this invention.

Figure 6:
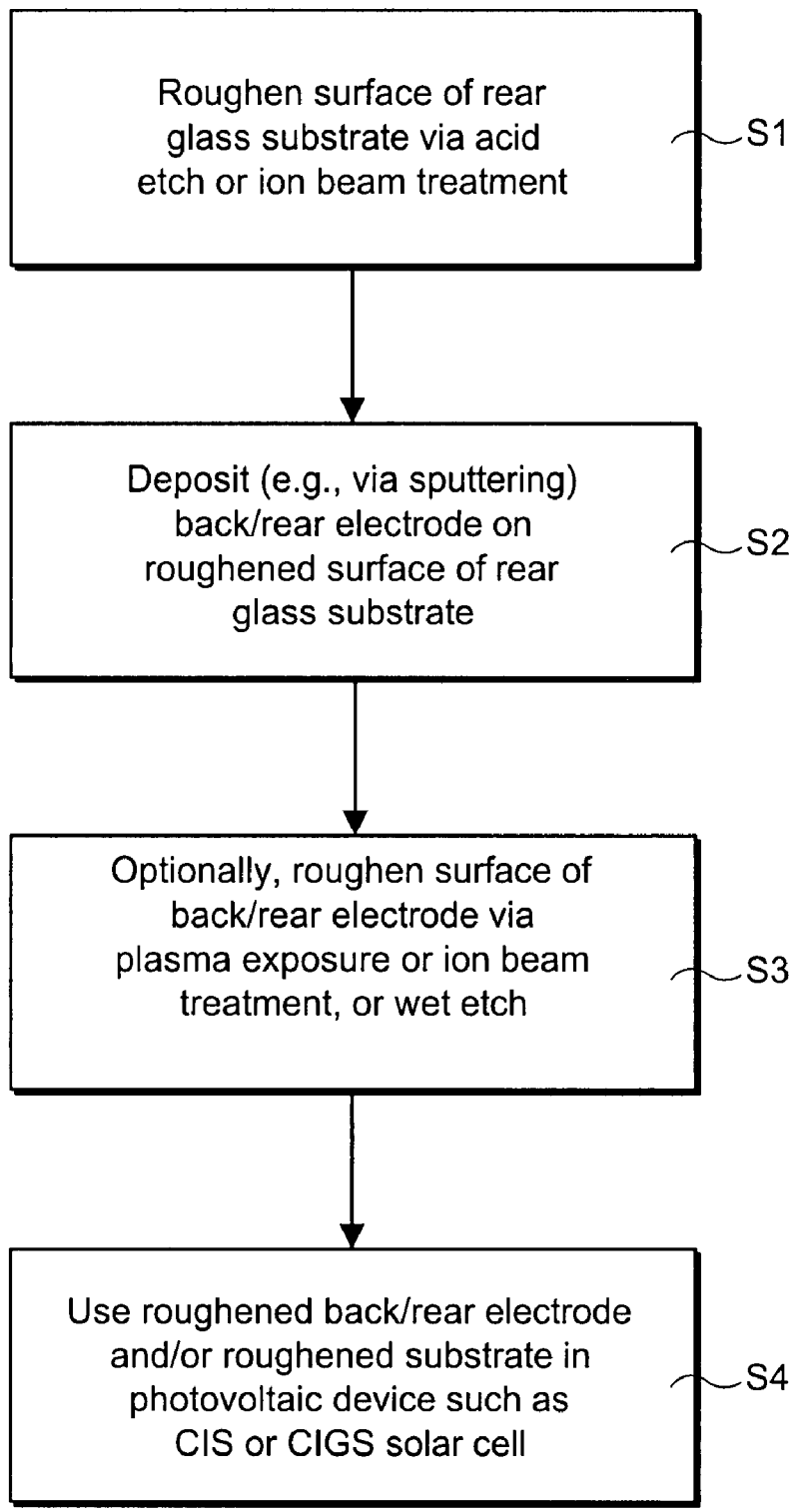
FIG. 6 is a flowchart illustrating how a rear electrode structure and/or photovoltaic device may be made according to an example embodiment of this invention.

FIG. 6 is a flowchart illustrating steps taken in making a photovoltaic device according to an example embodiment of this invention. Rear glass substrate 11 (e.g., soda-lime-silica based glass) is provided. The surface of the glass substrate to be closest to the semiconductor 5 is textured (roughened) as discussed above using any suitable technique, such as via ion beam treatment and/or acid etching (S1). If ion beam treatment is used, example ion sources and ion beam treating techniques are described in U.S. Pat. Nos. 7,049,003 and 6,878,403, the disclosures of which are hereby incorporated herein by reference. Then, the rear electrode 10 is deposited (e.g., via sputtering or the like) on the textured surface 11a of the rear glass substrate 11 so as to be substantially continuous across substantially the entire surface 11a of substrate; any rear electrode 10 discussed herein may be used (S2). Optionally, after the rear electrode 10 has been formed on the rear glass substrate 11, the major surface 10a of the rear electrode 10 to be closest to the light absorption semiconductor film 5 may be textured via one or more of ion beam treatment, plasma exposure, and/or a wet chemical etching such as HCl, nitric acid, and/or acetic acid or a combination thereof (S3). Again, if ion beam treatment is used in step S3, example ion sources and ion beam treating techniques are described in U.S. Pat. Nos. 7,049,003 and 6,878,403, which are incorporated herein by reference. After step S3, the rear electrode 10 may still be substantially continuous across substantially the entire surface 11a of the substrate. After the formation of the rear electrode 10 has been completed, then in certain example instances the semiconductor film 5 and front electrode 3 may then be deposited on the glass substrate 11 over the roughened rear electrode 10. Then, the front substrate 1 may be laminated to the rear glass substrate 11 via adhesive 2 or the like. The rear electrode structure is thus used in a photovoltaic device (S4).

Figure 7:
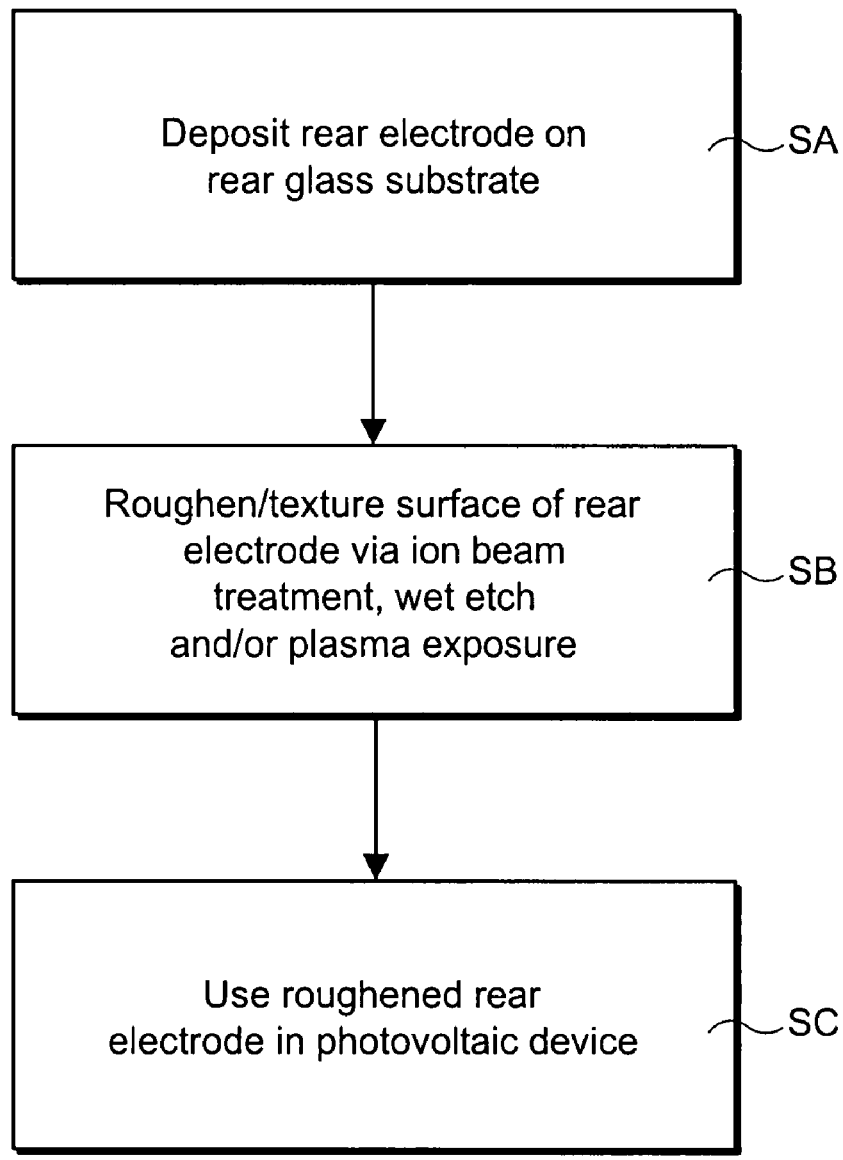
FIG. 7 is a flowchart illustrating how a rear electrode structure and/or photovoltaic device may be made according to another example embodiment of this invention.

FIG. 7 is a flowchart illustrating steps taken in making a photovoltaic device according to another example embodiment of this invention. This embodiment is the same as the FIG. 6 embodiment, except that the surface 11a of the rear glass substrate 11 need not be textured. In the FIG. 7 embodiment, rear glass substrate 11 (e.g., soda-lime-silica based glass) is provided (textured or not textured). Then, the rear electrode 10 is deposited (e.g., via sputtering or the like) on a major surface of the rear glass substrate 11 so as to be substantially continuous across substantially the entire surface of the substrate (SA); any rear electrode 10 discussed herein may be used. After the rear electrode 10 has been formed on the rear glass substrate 11, its major surface to be closest to the semiconductor may or may not be textured. The major surface 10a of the rear electrode 10 to be closest to the light absorption semiconductor film 5 is then textured via one or more of ion beam treatment, plasma exposure, and/or a wet chemical etching such as HCl, nitric acid, and/or acetic acid or a combination thereof (SB). Again, if ion beam treatment is used in step SB, example ion sources and ion beam treating techniques are described in U.S. Pat. Nos. 7,049,003 and 6,878,403, which are incorporated herein by reference. After SB, the electrode 10 may still be provided across substantially the entire surface of substrate 11. Then, in certain example embodiments, the semiconductor film 5 and front electrode 3 may then be deposited on the glass substrate 11 over the roughened rear electrode 10. Then, the front substrate 1 may be laminated to the rear glass substrate 11 via adhesive 2 or the like in forming a photovoltaic device. The rear electrode structure is thus used in a photovoltaic device (SC).

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. A method of making a rear electrode structure for a photovoltaic device, the method comprising:
    providing a glass substrate;
    depositing a conductive electrode on the glass substrate, and then ion beam treating a major surface of the electrode in order to texture, or additionally texture, the major surface of the electrode thereby providing a textured electrode having a textured reflective surface, wherein said ion beam treating is performed so that following the ion beam treating the textured reflective surface of the electrode comprises peaks, valleys and inclined portions connecting the peaks and valleys, and wherein major surfaces of at least some of the inclined portions form an angle α of at least about 25 degrees with the plane and/or rear surface of the glass substrate; and
    using the textured electrode, supported by at least the glass substrate, as a rear electrode in a photovoltaic device.

2. The method of claim 1, wherein the electrode comprises Mo.

3. The method of claim 1, wherein a pattern of the textured reflective surface has a periodicity of from about 100 μm to 1 mm.

4. A method of making a rear electrode structure for a photovoltaic device, the method comprising:
    depositing a conductive electrode on a glass substrate, and then ion beam treating a major surface of the electrode in order to texture, or additionally texture, the major surface of the electrode thereby providing a textured electrode having a textured reflective surface;
    wherein the textured electrode, supported by at least the glass substrate, is to be used as a rear electrode in a photovoltaic device; and
    providing a front glass substrate, an electrically conductive and substantially transparent front electrode, and an active semiconductor film located so that the front electrode is provided between at least the semiconductor film and the front glass substrate in the photovoltaic device.

5. The method of claim 4, further comprising laminating the rear glass substrate which supports the textured electrode and the active semiconductor film to the front glass substrate via at least one adhesive layer.

6. The method of claim 4, wherein said ion beam treating is performed so that following the ion beam treating the textured reflective surface of the electrode comprises peaks, valleys and inclined portions connecting the peaks and valleys, and wherein major surfaces of at least some of the inclined portions form an angle α of at least about 25 degrees with the plane and/or rear surface of the glass substrate.

7. A method of making a rear electrode structure for a photovoltaic device, the method comprising:
    depositing a conductive electrode on a glass substrate, and then ion beam treating a major surface of the electrode in order to texture, or additionally texture, the major surface of the electrode thereby providing a textured electrode having a textured reflective surface;
    wherein the textured electrode, supported by at least the glass substrate, is to be used as a rear electrode in a photovoltaic device; and
    wherein viewed cross sectionally the textured reflective surface of the electrode comprises peaks, valleys and inclined portions connecting the peaks and valleys, and wherein major surfaces of at least some of the inclined portions form an angle α of from about 25-35 degrees with the plane and/or rear surface of the glass substrate.

8. The method of claim 7, further comprising providing a front electrode that comprises, moving away from a front glass substrate of the photovoltaic device toward a semiconductor film of the device, at least a first substantially transparent conductive substantially metallic infrared (IR) reflecting layer comprising silver and/or gold, and a first transparent conductive oxide (TCO) film located between at least the IR reflecting layer and the semiconductor film.

9. The method of claim 8, wherein the first TCO film comprises one or more of zinc oxide, zinc aluminum oxide, tin oxide, indium-tin-oxide, and indium zinc oxide.

10. The method of claim 7, further comprising forming a semiconductor film comprising CIGS and/or CIS on the glass substrate over the electrode.

11. The method of claim 7, wherein the electrode comprises Mo.

12. The method of claim 7, wherein a pattern of the textured reflective surface has a periodicity of from about 100 μm to 1 mm.

13. The method of claim 7, further comprising forming a semiconductor film comprising CIGS and/or CIS on the glass substrate over the electrode.

14. A method of making a rear electrode structure for a photovoltaic device, the method comprising:
    depositing a conductive electrode on a glass substrate, and then ion beam treating a major surface of the electrode in order to texture, or additionally texture, the major surface of the electrode thereby providing a textured electrode having a textured reflective surface;
    wherein the textured electrode, supported by at least the glass substrate, is to be used as a rear electrode in a photovoltaic device; and
    wherein a pattern of the textured reflective surface has a periodicity of from about 100 μm to 1 mm.

15. A method of making a rear electrode structure for a photovoltaic device, the method comprising:
    depositing a conductive electrode on a glass substrate, and then ion beam treating a major surface of the electrode in order to texture, or additionally texture, the major surface of the electrode thereby providing a textured electrode having a textured reflective surface;
    wherein the textured electrode, supported by at least the glass substrate, is to be used as a rear electrode in a photovoltaic device; and
    forming a semiconductor film comprising CIGS and/or CIS on the glass substrate over the electrode.

16. The method of claim 15, wherein the electrode comprises Mo.

17. The method of claim 15, wherein a pattern of the textured reflective surface has a periodicity of from about 100 μm to 1 mm.

18. A method of making a rear electrode structure for a photovoltaic device, the method comprising:
    depositing a conductive electrode on a glass substrate, and then ion beam treating a major surface of the electrode in order to texture, or additionally texture, the major surface of the electrode thereby providing a textured electrode having a textured reflective surface;

wherein the textured electrode, supported by at least the glass substrate, is adapted to be used as a rear electrode in a photovoltaic device; and wherein the electrode comprises Mo.

19. The method of claim 18, wherein the electrode comprises a first layer comprising an oxide of Mo and a second layer comprising Mo provided on the substrate over at least the first layer.

20. The method of claim 18, wherein the electrode comprises a layer comprising Mo that is oxidation graded, continuously or discontinuously, so as to be more metallic at a location therein closer to a semiconductor film of the device than at a location therein closer to the glass substrate.

21. The method of claim 18, wherein the electrode comprises a first layer comprising Ti and/or Cr and a second layer comprising Mo provided on the substrate over at least the first layer.

22. A method of making a rear electrode structure for a photovoltaic device, the method comprising:

depositing a conductive electrode on a glass substrate, and then ion beam treating a major surface of the electrode in order to texture, or additionally texture, the major surface of the electrode thereby providing a textured electrode having a textured reflective surface;

wherein the textured electrode, supported by at least the glass substrate, is to be used as a rear electrode in a photovoltaic device; and texturing a surface of the glass substrate, and then said depositing of the conductive electrode is performed on the textured surface of the glass substrate.

23. The method of claim 22, wherein the electrode comprises a first layer comprising Ti and/or Cr and a second layer comprising Mo provided on the substrate over at least the first layer.

24. The method of claim 22, wherein the electrode comprises Mo.

25. The method of claim 22, wherein a pattern of the textured reflective surface has a periodicity of from about 100 μm to 1 mm.

26. The method of claim 22, further comprising forming a semiconductor film comprising CIGS and/or CIS on the glass substrate over the electrode.

\* \* \* \* \*